United States Patent

Reinhard et al.

[15] 3,656,065

[45] Apr. 11, 1972

[54] BIO-POTENTIAL ISOLATED AMPLIFIER

[72] Inventors: Clyde J. Reinhard, La Habra Heights; Donald D. Miller, Long Beach, both of Calif.

[73] Assignee: Beckman Instruments, Inc.

[22] Filed: June 12, 1970

[21] Appl. No.: 45,848

[52] U.S. Cl. ....................................330/10, 330/35, 330/24, 330/30 D

[51] Int. Cl. ..........................................................H03f 3/38

[58] Field of Search...............................330/10, 35, 30 D, 69

[56] References Cited

UNITED STATES PATENTS

| | | | |
|---|---|---|---|
| 3,388,338 | 6/1968 | Austin | 330/35 X |
| 3,430,125 | 2/1969 | Povenmire et al. | 330/10 X |
| 3,518,559 | 6/1970 | Kulp | 330/10 X |
| 3,434,069 | 3/1969 | Jones | 330/30 D |

*Primary Examiner*—Nathan Kaufman

*Attorney*—Paul R. Harder and Robert J. Steinmeyer

[57] ABSTRACT

A floating differential input amplifier is connected through a first field-effect transistor gate to an input winding of a signal transformer. An oscillator is connected to a primary winding of a power isolation transformer which transformer has one secondary winding connected to a rectifier circuit which in turn is connected to supply bias power to the differential amplifier. Another secondary winding of the power isolation transformer is connected to operate the first field-effect transistor gate. The output winding of the signal transformer is connected through a second field-effect transistor gate in series with a coupling capacitor to the input of a potentiometric operational amplifier. The potentiometric operational amplifier is connected to a filter amplifier and an overload detection circuit. An integrating amplifier is connected between the output of the filter amplifier and the input of the potentiometric operational amplifier to provide DC base line correction. The overload detection circuit is connected to operate a field-effect transistor switch connected to the input of the potentiometric operational amplifier and through which the input coupling capacitor can be rapidly charged. A common-mode driver amplifier has one input connected through a resistance network to the inputs of the floating differential amplifier and the other input connected to the common ground of the output circuitry. The output of the common mode driver is connected to an electrostatic cable shield surrounding the input leads connected to the differential amplifier inputs.

7 Claims, 1 Drawing Figure

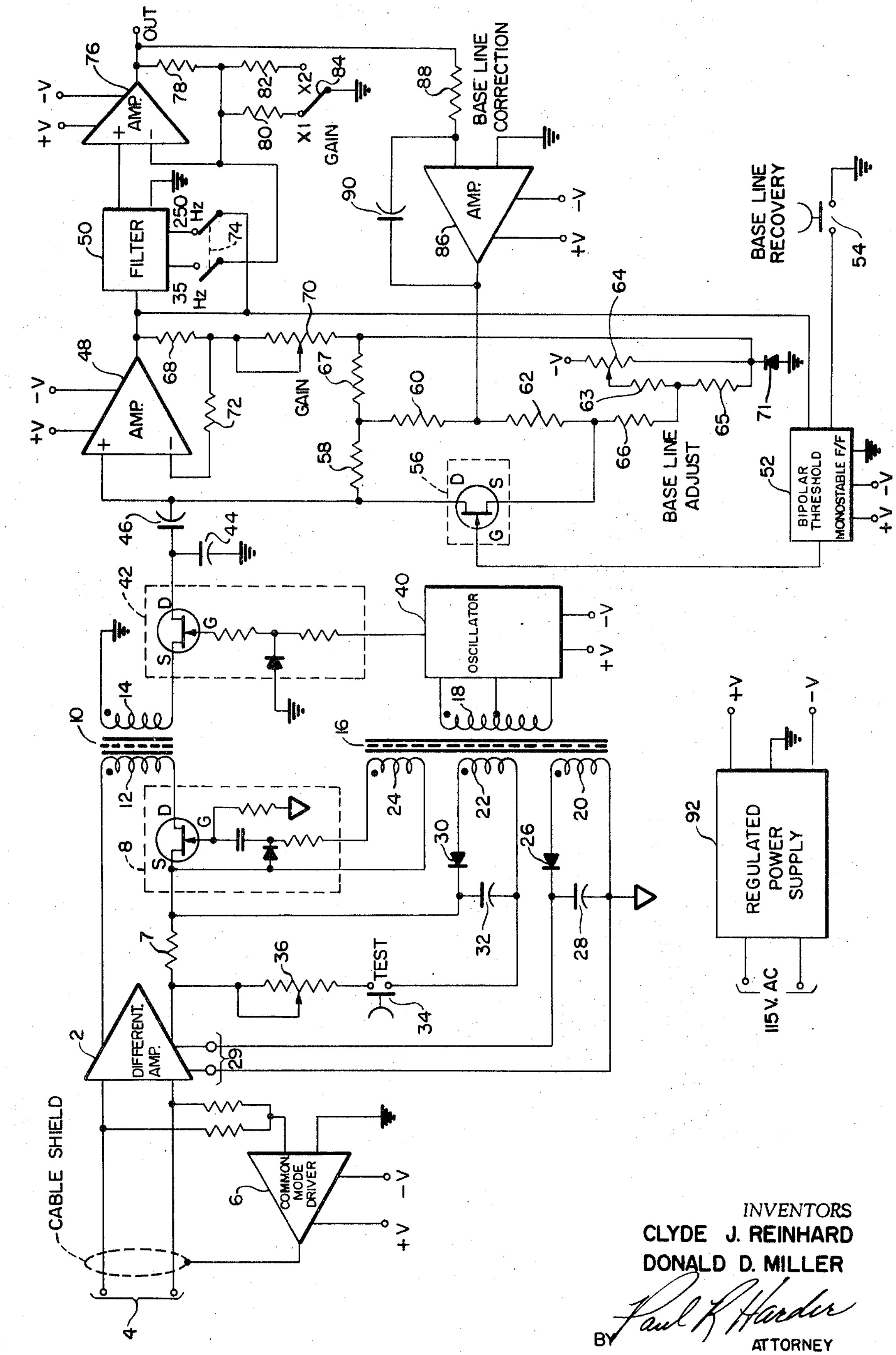
INVENTORS
CLYDE J. REINHARD
DONALD D. MILLER
BY Paul R Harder
ATTORNEY

BIO-POTENTIAL ISOLATED AMPLIFIER

The present invention relates to isolation amplifiers and more particularly to a bio-potential amplifier which isolates the measured object from the measuring apparatus to provide a true differential bio-potential measurement.

In the field of biological electrical measurements, it has been the general practice to employ amplifying apparatus having two electrodes between which the desired potential appears and a third electrode to establish a reference point for the other two electrodes. The third electrode or ground electrode is required in order to reduce the magnitude of the common mode signals which may be introduced on the two measuring electrodes. Although three electrode amplifying devices have served the purpose, they have not proved entirely satisfactory under all conditions of service for the reasons that considerable difficulty has been experienced from the generation of interfering ground loop voltages and currents between the measured subject and the measuring apparatus.

Those concerned with the development of bio-potential amplifiers have long recognized the need for isolating the measurement subject from the electrical ground of the measuring apparatus. There has been a continuous need for amplifier devices which are immune to extraneous common mode voltages and to the influence of interfering ground loop currents. The present invention fulfills this need.

One of the most critical problems confronting designers of bio-potential amplifiers has been to electrically isolate the measurement subject. In prior art measurement apparatus the measurement subject is connected to the measuring circuit ground by a third electrode which places the subject into a position of coming in contact with another electrical system whereby extraneous currents and voltages may be developed. This problem is overcome by the present invention.

The general purpose of this invention is to provide a bio-potential isolation amplifier which embraces all the advantages of similarly employed amplifiers having at least one reference or ground electrode connected to the measurement subject and possesses none of the aforedescribed disadvantages. To attain this, the present invention contemplates a unique combination of an oscillator, power isolation transformer, signal transformer, modulation and demodulation gates, DC base line correction and DC low-level overload base line correction circuits whereby interference of extraneous signals are avoided.

The use of a common oscillator in the present invention to provide power through an isolation power transformer to a floating differential amplifier as well as to provide electrical waveforms to synchronously operate the modulator and demodulator gates, results in a minimum number of components. Since the oscillator can operate at frequencies higher than the commonly used 60 cycle line frequency, the power isolation transformer can be of smaller size and weight than those used with 60 cycle power.

An object of the present invention is the provision of isolation of the measurement subject in a bio-potential measurement from extraneous voltages and currents.

Another object is to provide a common source of power and demodulation and modulation waveforms.

A further object of the invention is the provision of true differential bio-potential measurement.

Yet another object of the present invention is the provision of base line correction to compensate for long term amplifier drift.

Still another object is to provide rapid base line recovery from high differential input overload.

A still further object is to prevent interference from extraneous voltage and currents by isolation of the measurement subject from measurement apparatus chassis or earth ground.

Other objects and many of the attendant advantages of this invention will be readily appreciated as the same becomes better understood by reference to the following detailed description when considered in connection with the accompanying drawing.

The drawing illustrates a circuit diagram, partly in block form, of a preferred embodiment of the invention. Differential amplifier 2 has a pair of input leads 4 surrounded by an electrostatic cable shield which is connected to the output of common mode driver 6. One input to the common mode driver is connected to the pair of leads 4 through a pair of resistors. Another input to common mode driver 6 is connected to ground of the output circuit. The output of differential amplifier 2 is connected through a test resistor 7 in series with field-effect transistor gate 8 to input winding 12 of signal transformer 10, input winding 12 being electromagnetically coupled to an output winding 14. A power isolation transformer 16 has a primary winding 18 electromagnetically coupled to secondary windings 20, 22 and 24. A rectifying diode 26 is connected in series with one end of winding 20 to one end of a capacitor 28. The other end of capacitor 28 is connected to the other end of winding 20 to complete the series loop. Both ends of capacitor 28 are further connected to amplifier power supply terminals 29 of differential amplifier 2. Winding 22 has one end connected in series with rectifying diode 30 which in turn is connected to capacitor 32, the other end of capacitor 32 being connected to the other end of winding 22 to complete a series loop. The junction of diode 30 and capacitor 32 is connected to the junction of test resistor 7 and gate 8. The other end of test resistor 7 is connected through variable resistor 36 through a press to close test switch 34 which in turn is connected to the junction of capacitor 32 and winding 22. Winding 24 is connected to gate 8, one end of winding 24 being connected to the junction of test resistor 7 and gate 8, this junction being the source electrode of the field-effect transistor connected in a conventional well known gate configuration. The other end of winding 24 is connected through a series RC network to the gate electrode of the field-effect transistor, the drain electrode being connected to winding 12 of signal transformer 10.

Oscillator 40, which may be a conventional single transistor relaxation oscillator, is connected to winding 18 of power isolation transformer 16. Another output from oscillator 40 is connected through a resistor network to the gate electrode of field-effect transistor gate 42. The source electrode of field-effect transistor gate 42 is connected through winding 14 of signal transformer 10 to output circuit ground. The drain electrode of field-effect transistor gate 42 is connected to one end of capacitor 44 and capacitor 46, the other end of capacitor 44 being connected to output circuit ground and the other end of capacitor 46 being connected to the noninverting input of operational amplifier 48. The output of amplifier 48 is connected to filter 50 and to one input of a conventional monostable flip-flop 52 having a bipolar trigger circuit. Another input to flip-flop 52 is connected through a push-to-close switch 54 to ground. The output of flip-flop 52 is connected to the gate electrode of a field-effect transistor switch 56. The drain electrode of field-effect transistor switch 56 is connected to the noninverting input of amplifier 48 and one end of resistor 58. The other end of resistor 58 is connected to the junction of resistors 60 and 67. The other end of resistor 60 is connected to resistor 62 which in turn is connected to the junction of the source electrode of field-effect transistor switch 56 and resistor 66. Resistor 66 in turn is connected to the junction of resistors 63 and 65, resistor 63 in turn being connected to the variable arm of potentiometer 64. One end of potentiometer 64 is connected to a fixed potential −V. The other end of potentiometer 64 and of resistor 65 are connected together and to the anode of diode 71, the cathode of diode 71 being connected to output circuit ground. The other end of resistor 67 is connected to one end of variable gain resistor 70 and to the junction of resistors 64, 65 and diode 71. The other end of variable gain resistor 70 is connected to the junction of resistors 72 and 68, the other end of resistor 72 being connected to the inverting input of amplifier 48 and the other end of resistor 68 being connected to the output of amplifier 48.

A double-pole double-throw switch 74 has one pole connected to the output of amplifier 48 and the other pole connected to the inverting input of an amplifier 76. In one position switch 74 connects a 250 Hz. terminal of filter 50 to the output of amplifier 48. In the second position switch 74 connects a 35 Hz. terminal of filter 50 to the inverting input of amplifier 76. The output of filter 50 is connected to the noninverting input of amplifier 76. The output of amplifier 76 is connected through resistor 78 to the junction of resistors 80 and 82 and to the inverting input of amplifier 76. Resistors 80 and 82 are in turn respectively connected to an X 1 terminal and an X 2 terminal of the single-pole double-throw gain switch 84. The pole of switch 84 is connected to output circuit ground. The output of amplifier 76 is further connected through resistor 88 to one input of amplifier 86, the other input of amplifier 86 being connected to output circuit ground. Capacitor 90 is connected from the junction of resistor 88 and the input of amplifier 86 to the output of amplifier 86. The output of amplifier 86 is further connected to the junction of resistors 60 and 62.

Regulated power supply 92 provides power supply voltages +V and −V, with respect to output circuit ground, to common mode driver 6, oscillator 40, amplifier 48, amplifier 76, amplifier 86 and flip-flop 52. Regulated power supply 92 also provides a fixed bias potential −V to one end of base line adjust potentiometer 64.

Turning now to a description of the operation of the bio-potential isolation amplifier, input leads 4 illustrated in the drawing are connected to a source of bio-potential such as a pair of measuring electrodes connected to living subject. Since the measurement subject will generally be closely physically associated with the surrounding environment, it is not uncommon to encounter a considerable difference in potential between the measurement subject and the circuit ground of the measuring apparatus. If the measurement subject is grounded to the measurement apparatus, the subject may be exposed to voltages that may exist between other apparatus in his immediate environment and that of the measurement apparatus ground. Therefore, the measurement subject may be conductively, inductively or capacitively coupled to extraneous sources of common mode voltage with respect to the measurement apparatus ground. Although the present invention provides a floating input differential amplifier isolated from the apparatus ground, it is desirable to shield the input leads to the differential amplifier to reduce the capacitive coupling to other environmental items which may have extraneous potentials that differ from that of the measurement subject. Consequently, a common mode driver 6 detects the common mode voltage on the pair of input leads 4 with respect to the measurement apparatus ground, which in this case is the output circuit ground, to drive a cable electrostatic shield around the leads 4 to the same potential as that of the measurement subject with respect to the output circuit ground. This substantially eliminates the capacitive coupling of any extraneous signals to the input leads 4. Since there is no third electrode or reference electrode attached to the measurement subject, differential amplifier 2 is truly differential, amplifying only the voltage which exists between the input leads 4.

The bio-potentials applied to the input of differential amplifier 2 are characterized primarily by slowly varying DC potentials. These slowly varying DC potentials must be modulated or converted into an alternating signal such that they can be coupled through a signal transformer by which electrical isolation to all but the desired bio-potential signals is achieved. To provide the desired modulation, field-effect transistor gate 8 alternately provides a conducting and nonconducting path for the amplified signals appearing at the output of differential amplifier 2 to the input winding 12 of signal transformer 10. The alternating signal which appears across input winding 12 is electromagnetically coupled to output winding 14. In order to convert the alternating signal back into the slowly varying DC signal being measured, field-effect transistor gate 42 is alternately made conductive and nonconductive synchronously with gate 8 to demodulate the alternating signal from winding 14. Oscillator 40 provides the alternating electrical waveforms required to operate gate 42 and gate 8 in synchronism. In order to isolate oscillator 40 from the floating input circuit, power isolation transformer 16 couples the alternating electrical waveform of the oscillator to secondary windings 20, 22 and 24. Winding 24 provides the required alternating electrical waveform to operate gate 8.

Transformer 16 not only provides the operating waveform for gate 8, but also provides a source of alternating potential from which diode 26 and capacitor 28 can provide a supply of DC power for differential amplifier 2. A similar diode rectifier 30 and filter capacitor 32 are connected to winding 22 to supply a DC test voltage. This test voltage can be applied to test resistor 7 by depressing switch 34. The magnitude of the voltage across test resistor 7 can be adjusted by variable resistor 36. The change in voltage created across resistor 7 in response to depressing test switch 34 produces a step in voltage at the output of differential amplifier 2 thereby artificially creating a signal change which will be modulated and demodulated respectively by gates 8 and 42. Therefore, the functioning of all the circuitry following test resistor 7 can be checked and verified as operating properly.

From the above description it can be seen that the input differential amplifier 2, gate 8, and the power supply for differential amplifier 2 are all isolated, including the test circuit, from the output circuit ground. Although the common mode driver is referenced with respect to the output circuit ground, a high input impedance thereto provides necessary and sufficient isolation to extraneous common mode signals that may appear on leads 4.

As the gates 8 and 42 are operated in synchronism the voltage across capacitor 44 will substantially be proportional to the voltage at the output of differential amplifier 2. High frequency switching transients will be conducted by capacitor 44 to ground. As the voltage across capacitor 44 slowly varies, it is capacitively coupled through capacitor 46 to the input of operational amplifier 48. Since resistor 58 and the input impedance of amplifier 48 are high in value, the time constant formed by capacitor 46 and these impedances is sufficiently long to allow voltages of relatively low frequency to be coupled to amplifier 48. The input impedance to operational amplifier 48 is maintained at a high value by the potentiometric configuration provided by resistors 68, 72 and variable resistor 70. In this potentiometric configuration the variable resistor 70 controls the gain of amplifier 48.

The voltage drop across diode 71, which is forward biased by −V applied through potentiometer 64 to the anode of diode 71, provides a polarizing voltage for capacitor 46 thereby allowing capacitor 46 to be a polarized capacitor which provides a larger capacitance in a smaller physical size than can be obtained from non-polarized capacitors. Since the signals coupled through capacitor 46 are slowly varying DC signals, the capacitance must be large. Therefore, the use of a non-polarized capacitor would result in a component of large physical size and defeat the objectives for an amplifier of this type which in part are small size and weight.

The polarizing voltage for capacitor 46 provided by diode 71 may be in the order of 0.5 to 1.0 volts. This magnitude is sufficient for the amplitude of signals normally encountered. When the base line is adjusted for zero volts out of amplifier 76, the voltage across capacitor 46 will be substantially the drop across diode 71 having a polarity whereby the junction of capacitors 44 and 46 is positive with respect to the noninverting input of amplifier 48.

When a sudden change in voltage across capacitor 44 occurs in response to a sudden change in differential input, the sudden change in voltage will appear at the input to amplifier 48 and remain there until capacitor 46 is charged. If the voltage step is of sufficient magnitude to overload amplifier 48 by driving it to cut off or saturation, the measurement circuit will be inoperative during this period. To bring the measurement circuit back into its proper operating range, monostable flip-flop 52 detects when amplifier 48 goes into either cut off or saturation. These points are determined by preset threshold levels designed into the monostable flip-flop trigger circuit such that the flip-flop will not operate until either a plus or minus threshold level is exceeded. When either of the threshold levels is exceeded the flip-flop produces an output signal for a fixed interval of time which causes field-effect transistor switch 56 to be conductive and to connect capacitor 46 and the input to amplifier 48 to a low impedance potential point established at the junction of resistors 62 and 66. The potential at this point is developed by a potentiometer 64 and voltage divider resistor 63 and 65, ignoring for the moment any base line correction. Therefore, capacitor 46 can rapidly charge or discharge, as the case may be, allowing amplifier 48 to recover rapidly from overload or cut off. If it is desired to obtain the base line reference point during normal operation when there is no overload, switch 54 is provided to actuate the monostable flip-flop 52 in order to momentarily bypass base line correction and to permit capacitor 46 to charge or discharge to the base line adjust potential. This will become more clear in connection with the discussion in respect in base line correction hereinbelow.

The output of amplifier 48 is applied to filter 50. Filter 50 is a conventional RC filter which provides a switchable frequency response of either 35 Hz or 250 Hz under the control of switch 74. The output of filter 50 is applied to the input of potentiometrically connected operational amplifier 76. The potentiometric connection of amplifier 76 by means of resistors 78, 80 and 82 in conjunction with switch 84 provides a gain factor of X 1 or X 2 depending upon whether resistor 80 or resistor 82 is connected to output circuit ground through switch 84.

Since capacitor 46 will couple only the changes in voltage across 44 into the following amplifier 48, filter 50 and amplifier 76, it is necessary to establish a base line voltage to which these changes can be referenced. As mentioned above, potentiometer 64 in connection with divider resistors 63 and 65 provide a source of adjustable base line potential. However, since amplifier 48 and amplifier 76 generally will have DC drift, it will be necessary to compensate for this drift in order to provide a true base line reference. This compensation is provided by amplifier 86 in conjunction with resistor 88 and integrating capacitor 90. If a DC change at the output of amplifier 76 occurs, this change will be integrated slowly by amplifier 86, resistor 88 and capacitor 90 to provide a current into the junction of resistors 60 and 62 which in turn will result in a voltage change across resistor 67 and a resulting voltage change to the input of amplifier 48. This change in voltage at the input to amplifier 48 substantially compensates for the net DC drift created in amplifier 48 and amplifier 76 thereby providing an output from amplifier 76 unaffected by DC drift. Since the output of amplifier 86 is a current, the potentials due to the base line correction current flowing in the respective resistors will add or subtract to the base line potential established by potentiometer 64.

It now should be apparent that the present invention provides a bio-potential isolated amplifier circuit employing a minimum of components, which provides a floating input by which a measurement subject is isolated from extraneous voltages and currents that may occur with respect to the output circuit ground and which substantially eliminates interference from the extraneous voltages and currents. Although particular components and circuit configurations have been discussed in connection with the specific embodiment of the circuit constructed in accordance with the teachings of the present invention, others may be utilized. Furthermore, it will be understood that although an exemplary embodiment of the present invention has been disclosed and discussed, other applications and circuit arrangements are possible and that the embodiment disclosed may be subjected to various changes, modifications and substitutions without necessarily departing from the spirit of the invention.

What is claimed is:

1. A patient-isolated bio-potential amplifier having a floating input and a grounded output comprising:

an oscillator for generating a repetitive electrical pulse waveform;

an isolation power transformer having a primary and a multiplicity of secondary windings of which the primary is connected to said oscillator;

a rectifier diode connected in series with a first winding of said multiplicity of secondary windings;

a filter capacitor connected across said rectifier diode and said first winding connected in series;

a differential amplifier having a pair of input terminals, a pair of output terminals and a pair of bias terminals, said pair of input terminals forming the floating input terminals for the patient-isolated bio-potential amplifier, said pair of bias terminals being connected across said filter capacitor;

a first field-effect-transistor gate having its source electrode connected to one of said differential amplifier pair of output terminals and to one end of a second winding of said multiplicity of secondary windings;

means connecting the gate electrode of said first field-effect-transistor gate to the other end of the second winding of said multiplicity of secondary windings;

an isolation signal transformer having input and output windings, one end of said input winding being connected to the drain electrode of said field-effect-transistor gate and the other end to the other of said pair of output terminals of said differential amplifier, one end of said output winding forming the grounded output terminal of the bio-potential amplifier;

a second field-effect-transistor gate having its source electrode connected to the other end of said isolated signal transformer output winding;

means connecting the gate electrode of said second field-effect-transistor gate to an output of said oscillator;

a coupling capacitor connected to the drain electrode of said second field-effect-transistor gate;

a potentiometric operational amplifier having its non-inverting input connected to said coupling capacitor;

resistor means interconnecting the output of said potentiometric operational amplifier with its inverting input; a monostable flip-flop having a bipolar trigger threshold level, said monostable flip-flop being connected to the output of said operational amplifier for detecting when the output potential of said operational amplifier exceeds said threshold level;

a field-effect-transistor switch having its drain electrode connected to said operational amplifier noninverting input and its source electrode connected to a movable tap of a variable potentiometer; and means connecting the gate of said field-effect-transistor switch to said monostable flip-flop such that the said transistor switch is rendered conductive when said flip-flop changes state in response to said operational amplifier output potential exceeding said bipolar trigger threshold level whereby said coupling capacitor is rapidly charged or discharged to provide rapid overload recovery.

2. The patient-isolated bio-potential amplifier defined in claim 1 further including a base line correction circuit, comprising:

filter amplifier means connected to the output of said potentiometric operational amplifier;

an integrating amplifier having its input connected to the output of said filter amplifier; and means connecting the output of said integrating amplifier to the noninverting input of said potentiometric operational amplifier.

3. The patient-isolated bio-potential amplifier defined in claim 1 further including circuit means connected to said variable potentiometer for providing a polarizing voltage to said capacitor, and wherein said capacitor comprises a polarized capacitor.

4. A patient-isolated bio-potential amplifier providing high common mode rejection comprising:

a differential amplifier having a pair of floating input terminals adapted to receive bio-potential signals, a pair of bias terminals, and a pair of output terminals;

a modulator circuit having an input connected to the output terminals of said differential amplifier and an output;

an isolation transformer having a primary winding connected to the output of said modulator circuit and a secondary winding electromagnetically coupled with said primary winding;

a demodulator circuit having an input connected to the secondary winding of said isolation transformer, and having an output;

an operational amplifier having an inverting input, an output electrically interconnected with said input, and having a non-inverting input;

a capacitor electrically connected to the output of said demodulator and to the non-inverting input of said operational amplifier;

signal generator means having first, second and third electrically isolated outputs, said generator means adapted to receive power from a suitable regulated supply and produce alternating signals upon said isolated outputs in response thereto;

circuit means connecting the first output of said signal generator means to the bias terminals of said differential amplifier for providing an isolated bias voltage thereto; and circuit means connecting the second and third outputs of said signal generator means to the modulator and demodulator circuits, respectively, for providing synchronized gating signals to said modulator and demodulator circuits.

5. A patient-isolated amplifier as defined in claim 4 further including a common mode driver circuit having one input connected to ground and another input connected, respectively, to each of the floating input terminals of said differential amplifier;

a cable shield surrounding said floating input terminals; and circuit means connecting an output of said common mode circuit to said cable shield.

6. A patient-isolated amplifier as described in claim 5 further including base line correction circuit means connected between the output and the non-inverting input of said operational amplifier for providing a feedback signal to correct for DC drift in the output of said operational amplifier.

7. A patient-isolated amplifier as described in claim 5 further including a switch having one terminal connected to the operational amplifier side of said capacitor, said capacitor comprising a polarized capacitor, gate circuit means connected to a gate of said switch for providing a gating signal thereto; and circuit means connected to another terminal of said switch and to said capacitor for providing a polarizing potential to said capacitor.

* * * * *